United States Patent [19]

Sioshansi

[11] Patent Number: 4,855,026

[45] Date of Patent: Aug. 8, 1989

[54] SPUTTER ENHANCED ION IMPLANTATION PROCESS

[75] Inventor: Piran Sioshansi, Bedford, Mass.

[73] Assignee: Spire Corporation, Bedford, Mass.

[21] Appl. No.: 201,595

[22] Filed: Jun. 2, 1988

[51] Int. Cl.⁴ .............................................. C23C 14/34
[52] U.S. Cl. ........................ 204/192.11; 204/192.15; 204/298; 148/4
[58] Field of Search ...................... 204/192.11, 192.16, 204/192.31, 298; 148/4, 421, 900

[56] References Cited

U.S. PATENT DOCUMENTS

| | | | |
|---|---|---|---|
| 3,900,636 | 8/1975 | Curry et al. | 427/38 |
| 3,925,116 | 12/1975 | Engel | 148/143 |
| 4,465,524 | 8/1984 | Dearnaley et al. | 148/31.5 |
| 4,693,760 | 9/1987 | Sioshansi | 148/4 |
| 4,747,922 | 5/1988 | Sharp | 204/192.11 |

FOREIGN PATENT DOCUMENTS

| | | | |
|---|---|---|---|
| 0166349 | 1/1986 | European Pat. Off. | 204/192.11 |
| 156312 | 8/1982 | German Democratic Rep. | |
| 156462 | 9/1982 | German Democratic Rep. | |
| 133518 | 8/1983 | German Democratic Rep. | |
| 0174459 | 10/1982 | Japan | 204/192.11 |

OTHER PUBLICATIONS

Weissmantel et al., "Preparation . . . Methods", Thin Solid Films, 63 (1979), pp. 315–325.
R. A. Kant et al, "Ion Beam Modification of TiN Films During Vapor Deposition", *Materials Science & Engineering*, 90 (1987), 357–365.
F. A. Smidt et al, "U.S. Navy Manufacturing Technology Program on Ion Implantation", *Materials Science & Engineering*, 90 (1987), 385–397.
C. Weissmantel, "Ion Beam Deposition of Special Film Structures ", *J. Vac. Sci. Technology*, 18 (2), Mar. 1981, 179–185.

*Primary Examiner*—Nam X. Nguyen
*Attorney, Agent, or Firm*—Morse, Altman, Dacey & Benson

[57] ABSTRACT

A sputter enhanced ion implantation process is disclosed that uses to advantage the ion beam sputtering phenomenon to deposit layers of coatings on surfaces of interest simultaneously with ion implanting that surface, and that without the use of a separate evaporation system. The process can be applied to almost any workpiece of varied geometries. The process can be used for the deposition of hard coatings as well as ion implanting soft solid lubricants into various substrates. The process is particularly suitable for improving the physical and chemical properties of workpieces exposed to excessive wear, erosion, corrosion and fatigue and workpieces benefitting from a reduced coefficient of friction, such as ball bearings, gears, toolings, orthopaedic surgical implants and the like.

4 Claims, 2 Drawing Sheets

SPUTTER ENHANCED ION IMPLANTATION PROCESS

BACKGROUND OF THE INVENTION

1. Field of the Invention

The present invention relates generally to ion implantation and, more particularly, to a sputter enhanced ion implantation process that uses to advantage the ion beam sputtering phenomenon for forming layers of coatings on surfaces of interest simultaneously with ion implanting that surface.

2. The Prior Art

Ion implantation is a well known process. As known, ion implantation improves the physical and chemical properties of the surfaces of workpieces, such as razor blades and surgical instruments. See U.S. Pat. No. 3,900,636 entitled "Method of Treating Cutting Edges." See also U.S. Pat. No. 3,925,116 entitled "Superhard Martensite and Method of Making the Same." Of particular interest has been the ion implantation of workpieces, such as surgical orthopaedic implants, made from titanium and its alloys, see U.S. Pat. No. 4,465,524 entitled "Titanium and its Alloys." While effectively improving the wear performance of titanium-alloy surgical implants, ion implantation thereof has caused the surfaces of the implants to discolor at spots. In a recently granted U.S. Pat. No. 4,693,760 of mine entitled "Ion Implantation of Titanium Workpieces Without Surface Discoloration," it is noted that the discolorations on the ion implanted workpieces are sputter deposited thereon from parts located within the workpiece handling endstation due to sputtering by the ion beam. By preventing undesirable sputtering occasioned by ion implantation, the process of my U.S. Pat. No. 4,693,760 has achieved its stated objective. The disclosure and teachings of my said U.S. Pat. No. 4,693,760 are incorporated herein by reference. In a copending and related application Ser. No. 167,632, filed Mar. 11, 1988, entitled "Method and Apparatus for the Ion Implantation of Spherical Surfaces," Group Art Unit 111, and assigned to a common assignee with this application, to wit, Spire Corporation of Bedford, Mass., the adverse undesirable effects of sputtering during ion implantation also have been recognized and dealt with. Other workers in the field also have described the significance and adverse effects of sputtering experienced during the ion implantation of components for wear and corrosive protection. See F. A. Smidt et al, "U.S. Navy Manufacturing Technology Program on Ion Implantation," *Materials Science and Engineering,* 90(1987) pp. 385-397. These workers have noted, inter alia, that sputtering is an effect which must be taken into consideration for high fluence ion implantation. They have specifically noted that the "sputtering yield" depends on the energy deposition function, the escape depth for a sputtered ion, and the binding energy to the surface. They have also noted that the sputtering yield is a function of the angle of incidence of the ion beam on the sample. One of the consequences of this angular dependence of sputtering, these workers have observed, is the fact that the retained ion implanted dose at steady state is a function of the geometry of the part being ion implanted.

Recently, certain unexpected advantages have been obtained using a hybrid process designated as ion-beam-assisted deposition (IAD), also referred to as ion-beam-enhanced deposition (IBED). See R. A. Kant et al, "Ion Beam Modification of TiN Films During Vapor Deposition," *Materials Science and Engineering,* 90(1987), pp. 357-365. In this hybrid process, a sample is provided with layers of coatings by reactive vapor deposition while at the same time the deposited layers are also exposed to bombardment by energetic ions of an ion beam. Some of these unexpected advantages have included a reduced oxygen contamination in the deposited layers of coatings, a broader coating-substrate interface, larger grains and increased lattice constants in the deposited layers of coatings, with the coatings being both denser and more adherent than conventionally prepared coatings without simultaneous ion bombardment. Additionally, the hybrid process allows for the production of considerably thicker layers of similar composition and structure to those obtained by direct ion implantation. The hybrid process also permits the fabrication of deposited coatings of unique microstructures, such as amorphous or metastable phases, it extends the range of allowable processing conditions, including deposition at room temperature, and it also provides for ion beam mixing of the coating-substrate interface. The hybrid process also is believed to reduce some of the problems encountered during conventional vapor deposition, namely poor adherence, high porosity and high internal stress prevalent in the vapor deposited layers. The hybrid process requires, however, the concurrent utilization of an ion beam implanter and of a reactive evaporation system, both designed to impact on a sample in a specially designed deposition chamber. The process is thus both expensive and cumbersome.

SUMMARY OF THE INVENTION

It is a principal object of the present invention to overcome the above disadvantages by providing a simplified process that achieves all of the advantages of the abovedescribed hybrid process but without the need for a separate evaporation system.

More specifically, it is an object of the present invention to provide a sputter enhanced ion implantation process that uses to advantage the heretofore undesirable by-product of ion beam implantation, to wit, sputtering, to deposit layers of coatings on surfaces of interest simultaneously with ion implanting that surface and employing but an ion beam for accomplishing both tasks. The process essentially includes providing a fixture formed of a material intended for forming the coating on a workpiece presented by the fixture to an ion beam for simultaneous ion implantation. The coating is formed on the workpiece by sputtering of the fixture material upon being exposed to the ion beam, while the ion beam directly striking the workpiece and the thereon forming layers of coating is responsible for effecting the ion implantation of the surface of the workpiece. The process of the invention is applicable to almost any workpiece of whatever geometry. The process is useful for the deposition of hard coatings as well as ion implanting soft solid lubricants into various materials serving as substrates. The process of the invention is particularly suitable for improving, at reduced expense, the physical and chemical properties of workpieces designed to be exposed to excessive wear, erosion, corrosion and fatigue and workpieces benefitting from exhibiting a lower coefficient of friction at their surfaces. Some of such workpieces include ball bearings, industrial gears and toolings, and orthopaedic surgical implants and the like.

Other objects of the present invention will in part be obvious and will in part appear hereinafter.

The invention accordingly comprises the process of the present disclosure, its components, parts and their interrelationships, the scope of which will be indicated in the appended claims.

BRIEF DESCRIPTION OF THE DRAWINGS

For a fuller understanding of the nature and objects of the present invention, reference is to be made to the following detailed description, which is to be taken is connection with the accompanying drawings, wherein.

DETAILED DESCRIPTION OF THE PREFERRED EMBODIMENT

In general, the present invention pertains to a sputter enhanced ion implantation process that uses to advantage the ion beam sputtering phenomenon for depositing layers of coatings on surfaces of interest simultaneously with ion implanting that surface.

Ion implantation to improve the physical and chemical properties of the surfaces of workpieces is well known. It also is known that the wear resistance of certain metals, such as titanium and its alloys, can be markedly improved by first providing their surfaces with a layer of metal coating by electron beam evaporation and then subjecting the coated surfaces to bombardment with light ions of an ion beam, causing part of the metal coating to embed into the titanium surface. See U.S. Pat. No. 4,465,524, above mentioned. This patent, in also recognizing and mitigating the harmful effects of sputtering of the surface during ion implantation, employs light ions the mass of which is insufficient to cause such sputtering. One of the noted harmful effects of sputtering, in particular as applicable to orthpaedic surgical implants formed of Ti and/or its alloys, has manifested itself as surface discoloration. Its elimination during ion implantation represents the salient purpose of my said prior U.S. Pat. No. 4,693,760. The disclosure and teachings of this Patent No. 4,693,760 have been incorporated herein by reference. Others also have recognized the harmful effects of sputtering during ion implantation, see the article by F. A. Smidt et al. mentioned above.

Figure 1:
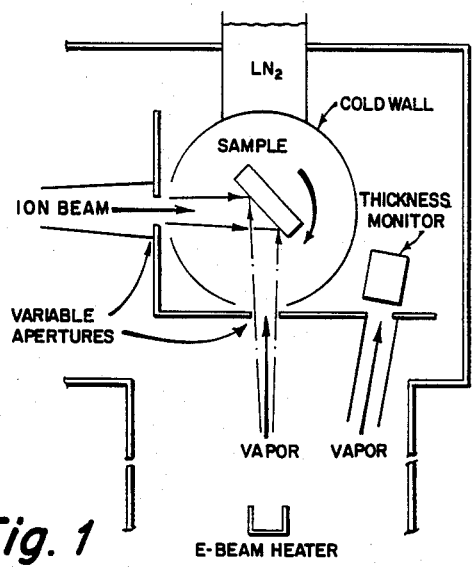
FIG. 1 is a schematic representation of a prior art ion-beam-enhanced deposition system employing an ion beam implanter and a separate reactive vapor deposition device.

Some workers in the field have recently begun studying the role and effect of bombarding by energetic ions thin films during their reactive vapor deposition. See the R. A. Kant et al article referred to above. The study described therein pertains to an experimental system based on the concurrent use of an ion beam implanter together with an electron beam evaporation system. This hybrid technique has come to be known as ion-beam-enhanced deposition (IBED). FIG. 1 herein is a schematic representation of such an IBED system and has been reproduced in fact directly from said R. A. Kant article, specifically from page 358 thereof. As stated in said article, the IBED system of simultaneous ion implantation and thin film deposition is thought to offer many potential benefits. The IBED system allows for the fabrication of thicker layers of similar composition and structure to those obtained by ion implantation only. The IBED system also allows for the fabrication of unique microstructures, such as amorphous or metastable phases. The IBED system also allows for the extension in the range of allowable processing parameters, including deposition at room temperatures. The IBED system also allows for ion beam mixing of the film-substrate interface. The IBED system, according to the authors of said article, may also allow for the reduction and/or potential elimination of many of the problems encountered in thin film deposition, namely, poor adherence of the deposited film, and high porosity and high internal stress found in the deposited thin film. The IBED system represents, therefore, a most promising advance in the ion implantation art.

The present invention is designed to achieve most, if not all, of the advantages of the IBED system without the need of employing a separate electron beam evaporation system. The process of the present invention is based on harnessing to advantage the ion beam sputtering phenomenon rather than suppressing it. The inventive process essentially comprises providing a fixture formed of a material intended for forming the layers of coatings on a workpiece presented by the fixture to an incoming ion beam for simultaneous ion implantation. The layers of coatings are formed on the surface of the particular workpiece by sputtering of the fixture material upon it being exposed to the ion beam. Simultaneously with the workpiece being sputter coated by the fixture material, the workpiece and the thereon forming coating are both being ion implanted by the energetic ions directly striking the surface of the workpiece.

The process of the invention can be used practically on any workpiece with varied geometries. The process will now be described in more detail with reference to the drawing figures designed to illustrate, but not to limit, the applicability of the inventive process to various and variously shaped workpieces.

As mentioned, the disclosure and teachings of my U.S. Pat. No. 4,693,760, granted Sept. 15, 1987, have been incorporated herein by reference. In particular, reference is made to FIG. 6 of said U.S. Pat. No. 4,693,760, which depicts a schematic view of an ion beam implanter with a workpiece handling endstation. The respective representative fixtures and workpieces illustrated in FIGS. 2-7 herein are all designed to be operatively mounted for cooling and/or rotation in the implantation chamber (i.e., the workpiece handling endstation) of such an ion beam implanter as shown and disclosed in said U.S. Pat. No. 4,693,760.

Figure 2:
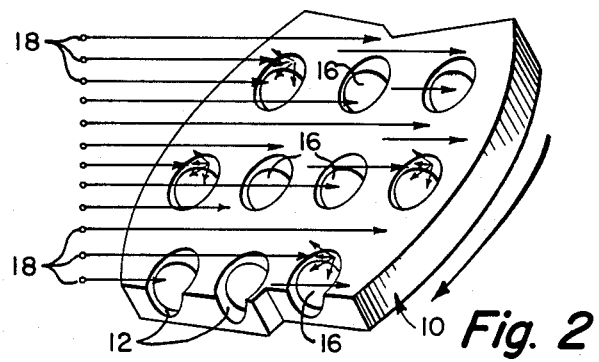
FIG. 2 is an isometric perspective view of a fixture designed to present a plurality of workpieces to an ion beam in carrying out the process of the invention.
Figure 3:
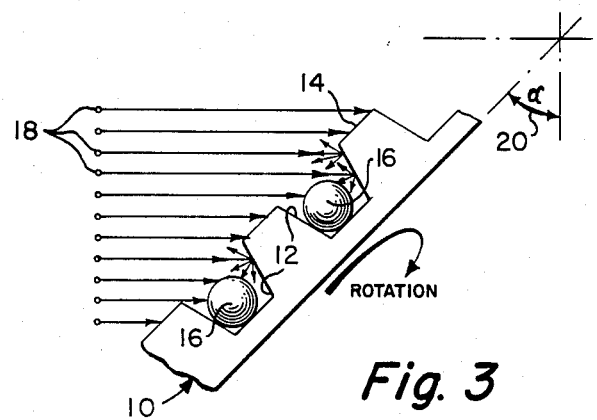
FIG. 3 is a partial side view of the fixture and the workpieces shown in FIG. 2.

In FIGS. 2-3, there is illustrated a fixture 10, which essentially is a plate formed with a plurality of cavities 12 in its front surface 14. Fixture 10 is removably mounted, for both rotation and cooling, on a base plate disposed within the implantation chamber of the ion beam implanter, see said U.S. Pat. No. 4,693,760. The cavities 12 are designed to accomodate a plurality of workpieces 16, herein being ball bearings, and to present these workpieces 16 to energetic ions 18 of an ion beam generated by said ion beam implanter. It will be noted that the fixture 10 is presented to the ion beam at an angle, as indicated by an arrow 20, from the vertical. This angle can vary from about 10° to about 80°, and preferably is about 45°. The selection of a specific angle is tailored to the task at hand, since it critically affects the implantation parameters and the resultant product of the sputter enhanced ion implantation process of the invention.

It also will be noted that certain of the incoming energetic ions 18 strike the workpieces 16 directly, certain other energetic ions 18 strike the front surface 14 of the fixture 10 directly, and certain other energetic ions 18 strike the walls of the plurality of cavities 12 directly. The energetic ions 18 striking directly the plurality of workpieces 16 effect ion implantation of the surfaces thereof. The energetic ions 18 striking the front surface 14 directly do not appreciably affect the process of the invention. However, the energetic ions 18 striking the walls of the plurality of cavities 12 cause sputtering of the material thereof, depending on its sputtering coefficient and the energy level of the ion beam. It is this sputtering of the fixture 10, specifically of its component material, heretofore to be suppressed as undesirable, that the inventive process employs to advantage. It is the component material of the fixture 10 that serves as the material for forming the layers of coatings, by sputtering, on the surfaces of the workpieces 16 simultaneously as these workpieces 16 are being ion implanted by the directly impinging energetic ions 18 thereon. Consequently, the energetic ions 18 directly striking the surfaces of the workpieces 16 not only penetrate these surfaces themselves, but in addition also serve to nail down the layers of sputter coatings simultaneously formed on the surfaces. Furthermore, the energetic ions 18 striking these surfaces, as they are being coated by sputtering, also propel some portions of the thereon sputtered layers of fixture material into the surfaces of the workpieces 16 themselves. Further and depending on the choices of the component material for the fixture 10 and of the specific energetic ions 18 generated by the ion implanter to impact on that specific fixture material, various advantageous chemical compositions and/or precipitates can be formed on the surfaces of the workpieces 16 or being implanted into those surfaces. The distances of implantation below the surfaces are largely influenced by: the level of energy of the ion beam, its current density, the ion dose on the surfaces of the workpieces 16 and of the fixture 10, its geometry factor, the maximum allowed temperature of the fixture 10 and of the workpieces 16, and the time duration of the ion implantation.

It will be appreciated that the fixture 10 is both rotated, as indicated by an arrow, and cooled to a certain maximum temperature. As the fixture 10 is rotated, the workpieces 16, i.e., the ball bearings herein, also rotate in their respective cavities 12, exposing thereby different surface areas thereof to the incoming energetic ions 18, as well as to the indirect actions of those energetic ions 18 striking the internal containing walls of the cavities 12. As a consequence, the entire surface of the workpieces 16 is uniformly coated by the fixture material and is uniformly implanted by the energetic ions 18 of the ion beam. The varied combinations of fixture materials and choice of energetic ions to subject the workpieces 16 to the process of the invention is limited only by the experimenter's imagination and/or the compatibility of the materials forming the workpieces 16 themselves.

A further obtained advantageous result of the invention process resides in that the ion implantation yield, heretofore often less than 20 atomic percent due to sputtering, does not reach saturation levels until it well exceeds 20 atomic percent, and being about 100 atomic percent.

During the sputter enhanced ion implantation, the relative exposure of the workpieces 16 to the direct impact of the energetic ions 18 versus the impact of the sputtering from the fixture 10 can be held constant by keeping the angle 20 constant. This relative exposure also can be varied, however, by changing the angle of incidence of the ion beam impacting on the fixture 10 and the therein contained workpieces 16. This change can be simply effected, even during the ion implantation process itself, by changing the angle 20 of the fixture 10, or more precisely its cooled mounting plate, with respect to the ion beam. This relative exposure is further influenced by the specific composition of the fixture material and by the configuration and location of the fixture with respect to the workpieces contained therein or associated therewith.

The energy level of the ion beam can vary from about 500 eV to about 400 keV, and is typically about 50 keV to about 180 keV, depending on other process variables and the desired specifications for the ion implanted workpieces. The fixture 10 can be formed of one or more of the group consisting of Pb, Ag, Sn, In, Au, Mo, W, Ta, Ti, U, Be, Mn, Fe, Co, Cu, Cr, Al, V, Ni, Zn, Si, C, B, Hf, Y, Zr, Nb, Pd, Pt, Ir and Os. The energetic ions 18 of the ion beam, on the other hand, can contain one or more of the group including H, N, B, C, Ne, S, Pb, O, Si, Ar, Xe, Kr, Ag, Cr, Ti, Fe V, Co, Cu, Mn, Ni, Y, Zr, Nb, Mo, Hf, Ta, and W. The ball bearings 16 themselves can be formed of hardened steel, including austenite steel or martensite steel, or any other suitable metal.

Figure 4:
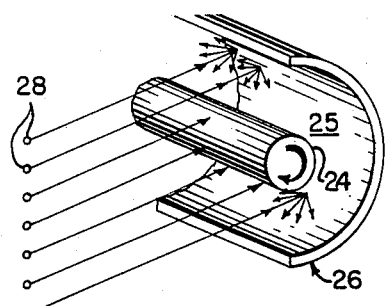
FIG. 4 is an isometric perspective illustrating a different fixture and a different workpiece being exposed to an ion beam in carrying out the process of the invention.
Figure 5:
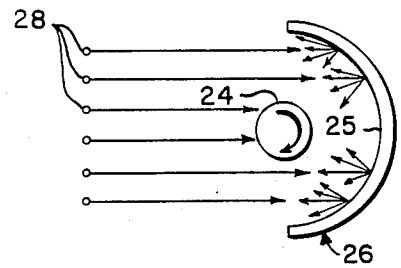
FIG. 5 is a side view of the fixture and workpiece shown in FIG. 4.

In FIGS. 4 and 5, the sputter enhanced ion implantation process of the invention is illustrated as being applied to a cylindrical industrial tooling 24. The cylindrical tooling 24 is rotatably mounted in operative association with its stationary fixture 26, which is shaped as one half of a hollow cylinder. Preferably, the longitudinal axis of the cylindrical tooling 24 is disposed concentric with the longitudinal axis of the fixture 26. Both the fixture 26 and the cylindrical tooling 24 are operatively mounted on a stationary cooled base plate disposed within the implant chamber of the ion beam implanter, see my said U.S. Pat. No. 4,693,760. It will be appreciated that, as in the previous example illustrated in FIGS. 2-3, certain energetic ions 28 will impinge on the rotating surface of the cylindrical tooling 24 while certain other energetic ions 28 will strike the inner concave surface 25 of the fixture 26, causing sputtering thereof. Some of this sputtering reaches the rotating surface of the cylindrical tool 24 and causes the formation of layers of coatings thereon. As these sputter formed layers of coatings are accumulated on the rotating surface of the cylindrical tooling 24, both the layers of coatings and the surface of the tooling 24 are ion implanted by the energetic ions 28 striking the cylindrical tooling 24 itself. The relative compositions of the component materials forming the cylindrical tooling 24, the fixture 26 and the energetic ions 28 of the ion beam can be as described in detail above with respect to the example shown in FIGS. 2 and 3.

Figure 6:
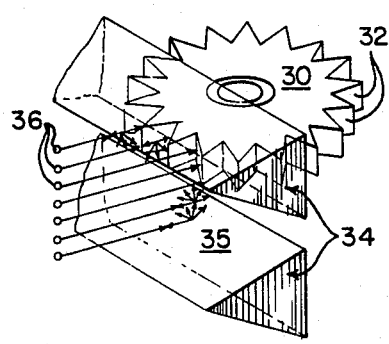
FIG. 6 is an isometric perspective illustrating yet another fixture and another workpiece being exposed to an ion beam in carrying out the process of the invention.
Figure 7:
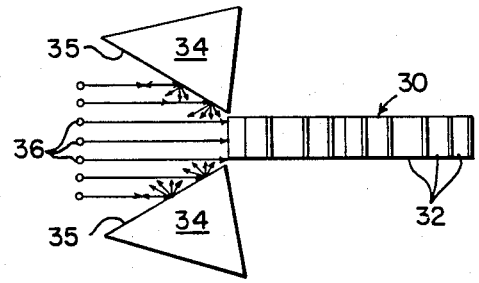
FIG. 7 is a side view of the fixture and workpiece shown in FIG. 6.

The sputter enhanced ion implantation process of the invention is illustrated in FIGS. 6 and 7 as being applied to a toothed gear 30, commonly encountered in various industrial products, more specifically, to the teeth 32 thereof. Gear 30 is rotatably mounted in operative association with a pair of stationary fixtures 34. Both the gear 30 and the pair of fixtures 34 are operatively mounted within the implant chamber of the said ion implanter. Although the pair of fixtures 34 are depicted as having a triangular cross section, such need not be the case. The operative side of the pair of fixtures 34 is the one side 35 currently exposed to the energetic ions 36 during ion implantation. Of course, the triangular shape of the pair of fixtures 34 allows for the presentation of the other two sides thereof in future implantations, would that become necessary or desirable. Such rotation of the surfaces of the pair of fixtures 34 may be called for when the originally exposed surfaces 35 become unusable for purposes of the invention process by extensive wear, as for example due to the effects of self-sputtering. As in the previous examples, certain of the energetic ions 36 strike the teeth 32 of the gear 30 directly, while other energetic ions 36 strike the surfaces 35 of the pair of fixtures 34 disposed at angle thereto. The latter cause sputtering of the fixture material to be deposited as layers of coatings on the teeth 32 of the gear 30, simultaneously with those teeth 32 being ion implanted by the directly impinging ions 36 thereon. The gear 30 is both rotated with respect to the pair of fixtures 34 and is cooled so as not to exceed a maximum predetermined level of temperature, which preferable is about 300° F. (or about 100° C.). The selection of the maximum temperature is influenced, among others, by the materials of the implantation target, of the fixtures and of the specific ions applied thereto.

Figure 8:
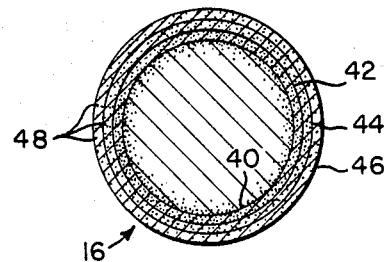
FIG. 8 is a schematic section, on an enlarged scale, of one of the workpieces illustrated in FIGS. 2-3 after the completion of the process of the invention.

In FIG. 8 is illustrated, in schematic section and on an enlarged scale, one of the plurality of workpieces 16 shown in FIGS. 2 and 3 after these workpieces 16 have been subjected to the sputter enhanced ion implantation process of the invention. The original surface 40 of the workpiece 16, a ball bearing, is shown enveloped by a plurality of layers 42, 44 and 46 of sputter induced coatings formed thereon. These plurality of layers 42, 44 and 46 are intentionally exaggerated in size and thickness for the purposes of illustration only. It will be recalled that these plurality of layers 42, 44 and 46 of coatings are primarily formed of the material comprising the fixture 10 and are interlaced by some of the energetic ions 18, shown as dots 48. It will also be recalled that certain of these energetic ions 18 directly impinging on the surface 40 of the ball bearing 16 have penetrated a certain distance into and below the surface 40. In so doing, some of these penetrating ions also have caused some of the sputtered ions of the fixture material also to be implanted onto and below the surface 40 of the ball bearing 16. It will also be understood that the thickness of these layers 42, 44 and 46 of sputter coatings depends on the implant parameters, in particular, the time duration of the sputter enhanced ion implantation process.

EXAMPLE I

Spherical workpieces 16 formed of 52100 steel, with a diameter size of 5/32", were subjected to the sputter enhanced ion implantation process of the invention in an ion implanter with the following implant parameters:
Ion beam current density: 2.0 uA/cm$^2$
Time duration of ion implantation: 10.5 hours
Ion species employed: N+
Angle of incidence of the ion beam: Was varied between about 40° and about 70°
Energy of ion implantation: 80 Kev
Maximum temperature of the workpieces 16: Less than 120° C.
Ion dose on workpieces 16: $1.5 \times 10^{17}$ ions/cm$^2$
Composition of fixture 10: Pb
Sputtering coefficient of the fixture 10: Ranges between about 8-15 atoms/ion
Ion dose on fixture 10: $4.5 \times 10^{17}$ ions/cm$^2$
Depth of ion implantation below the surface: About 2000 Angstroms $$\text{Geometry factor:} = \frac{\text{ion dose on fixture}}{\text{ion dose on workpieces}} = 3$$

EXAMPLE

A cylindrical tooling 24 formed of sapphire, with a diameter size of ⅜", was exposed to the sputter enhanced ion implantation in the ion implanter, with the following implant parameters:
Ion beam current density: 23 uA/cm$^2$
Time duration of ion implantation: 1.2 hours
Ion species employed: Ta
Energy of ion implantation: 120 Kev
Ion dose on the workpiece 24: $2 \times 10^{17}$ ions/cm$^2$
Composition of fixture 26: Ta
Sputtering coefficient of the fixture 26: Ranges from about 3 to about 10 atoms/ion
Ion dose on fixture 26: $6 \times 10^{17}$ ions/cm$^2$
Depth of ion implantation below the surface: About 200 Angstroms
Geometry factor: 3

EXAMPLE III

A toothed gear 30 formed of 9310 steel, with a diameter size of 3", was exposed to the sputter enhanced ion implantation in the ion implanter with the following implant parameters:
Ion beam current density: 4.0 uA/cm$^2$
Time duration of ion implantation: 4.4 hours
Ion species employed: Ar
Energy of ion implantation: 120 Kev
Ion dose on workpiece 30: $2 \times 17$ ions/cm$^2$
Composition of pair of fixtures 34: Ag
Sputtering coefficient of the fixtures 34: Ranges from about 6-12 atoms/ion
Ion dose on pair of fixtures 34: $4 \times 10^{17}$ ions/cm$^2$
Depth of ion implantation below the surface: About 1000 Angstroms
Geometry factor: 2

Thus it has been shown and described a sputter enhanced ion implantation process for the ion implantation and simultaneous sputter coating of workpieces, which process satisfies the objects and advantages set forth above.

Since certain changes may be made in the present disclosure without departing from the scope of the present invention, it is intended that all matter described in the foregoing specification or shown in the accompanying drawings, be interpreted in an illustrative and not in a limiting sense.

What is claimed is:

1. Sputter enhanced ion implantation process comprising:

(a) providing a fixture formed of a first material and designed to hold and present a workpiece to an ion beam;
(b) placing said workpiece in operative association to said fixture;
(c) exposing both said workpiece and said fixture to said ion beam;
(d) said ion beam striking said fixture causing a sputtered coating of said first material to be formed by sputtering on said workpiece while simultaneously therewith said ion beam striking said workpiece causing both said workpiece and said sputtered coating thereon to be ion implanted;
(e) said workpiece being formed of a second material, and said ion implantation of said workpiece effecting an ion implanting yield in excess of 20 atomic percent;
(f) said ion beam also effecting an implantation of ions of said first material into said workpiece while effecting ion implantation therein from said ion beam itself;
(g) wherein relative exposure of said workpiece to the direct impact of said ion beam versus the impact of said sputtering from said fixture caused by the indirect impact of said ion beans on said workpiece is variable by the angle of incidence of said ion beam on the surface of said workpiece, and wherein said relative exposure of said workpiece also depends on the composition of said first material; and
(h) wherein said workpiece is one of a group consisting of ball bearings and cylindrical toolings.

2. The process of claim 1 wherein said relative exposure of said workpiece also is affected by the configuration and location of said fixture with respect to said workpiece, and wherein said first material is titanium and wherein said ion beam comprises nitrogen ion, whereby said sputtered coating is formed of titanium nitride and said ion beam causes titanium nitride precipitates to be implanted into the surface of said workpiece, and wherein the energy of said ion beam varies from about 500 eV about 400 keV.

3. The process of claim 1 wherein said first material is formed of one or more of the group consisting of Pb, Ag, Sn, In, Au, Mo, W, Ta, Ti, V, Ni, Zn, Si, C, B, Hf, Y, Zr, Nb, Pd, Pt, Ir and Os.

4. The process of claim 1 wherein said ion beam is formed of one or more ions of the group consisting of H, N, B, C, Ne, S, Pb, 0, Si, Ar, Xe, Kr, Ag, Cr, Ti, Fe V, Co, Cu, Mn, Ni, Y, Zr, Nb, Mo, Hf, Ta, and W.

* * * * *